United States Patent [19]

Ashley et al.

[11] 4,034,285
[45] July 5, 1977

[54] SUPERHETERODYNE NOISE MEASURING DISCRIMINATORS

[75] Inventors: James R. Ashley, Colorado Springs, Colo.; Thomas A. Barley; Gustaf J. Rast, Jr., both of Huntsville, Ala.

[73] Assignee: The United States of America as represented by the Secretary of the Army, Washington, D.C.

[22] Filed: Aug. 30, 1976

[21] Appl. No.: 718,691

[52] U.S. Cl. .......................... 324/57 R; 324/57 H; 324/57 N
[51] Int. Cl.² .................................... G01R 27/00
[58] Field of Search ............ 324/57 R, 57 H, 57 N; 328/166, 165; 325/67, 363; 178/DIG. 12

[56] References Cited
UNITED STATES PATENTS

| | | | |
|---|---|---|---|
| 3,675,124 | 7/1972 | Ashley et al. | 324/57 N |
| 3,693,076 | 9/1972 | Nugent et al. | 324/57 N |

Primary Examiner—Stanley T. Krawczewicz
Attorney, Agent, or Firm—Nathan Edelberg; Robert P. Gibson; Freddie M. Bush

[57] ABSTRACT

A superheterodyne noise measuring discriminator uses an optimum length transmission line which permits near carrier frequency modulation to be measured on a carrier frequency in a broad range from approximately two megahertz to two gigahertz with one set of components. A balanced phase detector, power dividers, attenuators coupled with the optimum length transmission line and balanced mixing of signal and reference signals at an IF level provide wide frequency range discrimination. This noise measuring discriminator operates over a wide frequency range with the only component changes being an input bandpass filter, the optimum length transmission line, adjustable phase shift device, and variable frequency local oscillator. The transmission line sections are easily changed by simply selecting proper line lengths which may be previously established. The optimum length transmission line can operate over several octaves of frequency range with analyzer degradation of less than three decibels. In measuring frequency modulation noise, carrier nulling in excess of 60 decibels is accomplished. After this carrier null has been accomplished, the discriminator circuit rejects incidental amplitude modulation on the test signal.

7 Claims, 4 Drawing Figures

4,034,285

SUPERHETERODYNE NOISE MEASURING DISCRIMINATORS

DEDICATORY CLAUSE

The invention described herein may be manufactured, used, and licensed by or for the Government for governmental purposes without the payment to us of any royalties thereon.

BACKGROUND OF THE INVENTION

The use of frequency discrimination to measure near carrier frequency modulation noise of a microwave signal is discussed by Ashley et al. in the IEEE Transactions on Microwave Theory and Techniques, Volume MTT-16, No. 9, September 1968, pages 753–760. Prior art discrimination at microwave frequencies, as described in this paper, depended on a microwave cavity as a resonant circuit. Prior art discrimination at very high frequencies (VHF) utilize such components as slope detectors and ratio detectors, depending on the lumped circuit elements of inductance and capacitance, to form resonant circuits. Prior art at all frequencies tend to use amplifiers at either signal or IF to enable measurements to be made on low level signals. At ultrahigh frequencies (UHF) between the VHF and microwave region, there is little prior art on such discrimination means. Most measurements in this area are made by heterodyning the UHF signal with a local oscillator to obtain a VHF signal which is analyzed with a discriminator at a VHF frequency range. Accounting for frequency modulation (FM) noise of the local oscillator is a well established problem in these areas. Both the cavity method and the lumped circuit element method obtains a rejection of residual amplitude modulation (AM) noise on the signal under test; for example, the VHF discriminator usually employs a limiter or ratio detector. The microwave cavity discriminator rejects AM noise and also allows the input signal level to be increased, and provides the greatest discriminated output to improve the signal-to-threshold ratio, with the threshold being the lowest value of noise established or obtained within the analyzer system.

Among the discriminators discussed in prior art literature which might be useful in obtaining FM noise measurements at UHF or lower microwave frequencies is the transmission line discriminator as has been noted by R. A. Campbell in "Stability Measurement Techniques in the Frequency Domain", IEEE-NASA Symposium on Short Term Frequency Stability, NASA SP-80, Nov. 23–24, 1964, pages 231–235. Various aspects of detection equipment and calibration are disclosed. Also, in the IEEE Transactions on Microwave Theory and Techniques, Volume MTT-23, No. 9, September 1975, pages 776–778, an article entitled "Single Hybrid Tee Frequency Discriminator" by J. Nigrin et al. discloses a discriminator tuned by a movable short and has properties comparable to those of a phase discriminator. Additional prior art includes U.S. Pat. No. 3,675,124 entitled "Apparatus for Measuring Frequency Modulation Noise Signals and for Calibrating Same" by J. R. Ashley et al. This apparatus employs an auxiliary injection phase-locked oscillator driven by a test oscillator and relies on a discriminator cavity resonator which must be accurately tuned to the exact operating frequency for acceptable operation. Ashley et al. discusses in column 6 the difficulty of making signal measurements where limited power output make prior art methods ineffective.

Similarly, U.S. Pat. No. 3,079,563 entitled "Microwave Frequency Discriminator" by Marsh et al. wherein input signals are changed to an IF level before being applied to a detector. March et al. discuss the limits and feasibility of high Q cavities.

Applicants have related patent applications currently copending which also utilize the optimum length transmission line in discriminator devices. These related applications are:

Ser. No. 652,593 filed Jan. 26, 1976, now U.S. Pat. No. 4,002,970 issued Jan. 11, 1977 and entitled "Optimum Threshold Transmission Line Discriminator";

Ser. No. 652,446 filed Jan. 26, 1976, now U.S. Pat. No. 4,002,971 issued Jan. 11, 1977 and entitled "Wide Operating Frequency Range Transmission Line Discriminator"; and Ser. No. 652,445 filed Jan. 26, 1976, now U.S. Pat. No. 4,002,969 issued Jan. 11, 1977 and entitled "Optimum Length Transmission Line Discriminator With Low Noise Detector".

SUMMARY OF THE INVENTION

The noise measuring discriminator relates to measurement of frequency modulation noise on radio frequency signals. Measurement is enhanced by the use of an optimum length transmission line and IF amplifiers, providing AM noise rejection, ease of operation and threshold determination with low input signal power. Because of optimum line characteristics, broadband measurements of radio frequency signals can be accomplished with either a single optimum transmission line or a family of transmission lines so that the characteristic curves overlap. The discriminator operates in the high, very high and ultrahigh frequency regions for measuring near carrier FM noise. Use of coaxial components allows one set of measuring components to work for a broad frequency band with only a few changes of transmission line length and local oscillator devices to cover the extremely broadband range. In conjunction with the broadband operation, the signal-to-threshold is improved, the system measurement threshold is readily determined, incidental amplitude modulation (AM) on the signal under test is rejected, and the measured FM noise can be corrected for the established measurement threshold.

An alternative embodiment of the discriminator employs a high Q cavity resonator at the higher radio frequencies instead of the optimum length transmission line. Threshold attenuation for determining and correcting internal noise of the system simultaneously with this cavity resonator discrimination allows increased sensitivity of noise discrimination to be accomplished at the higher frequencies.

DESCRIPTION OF THE PREFERRED EMBODIMENTS

Figure 1:
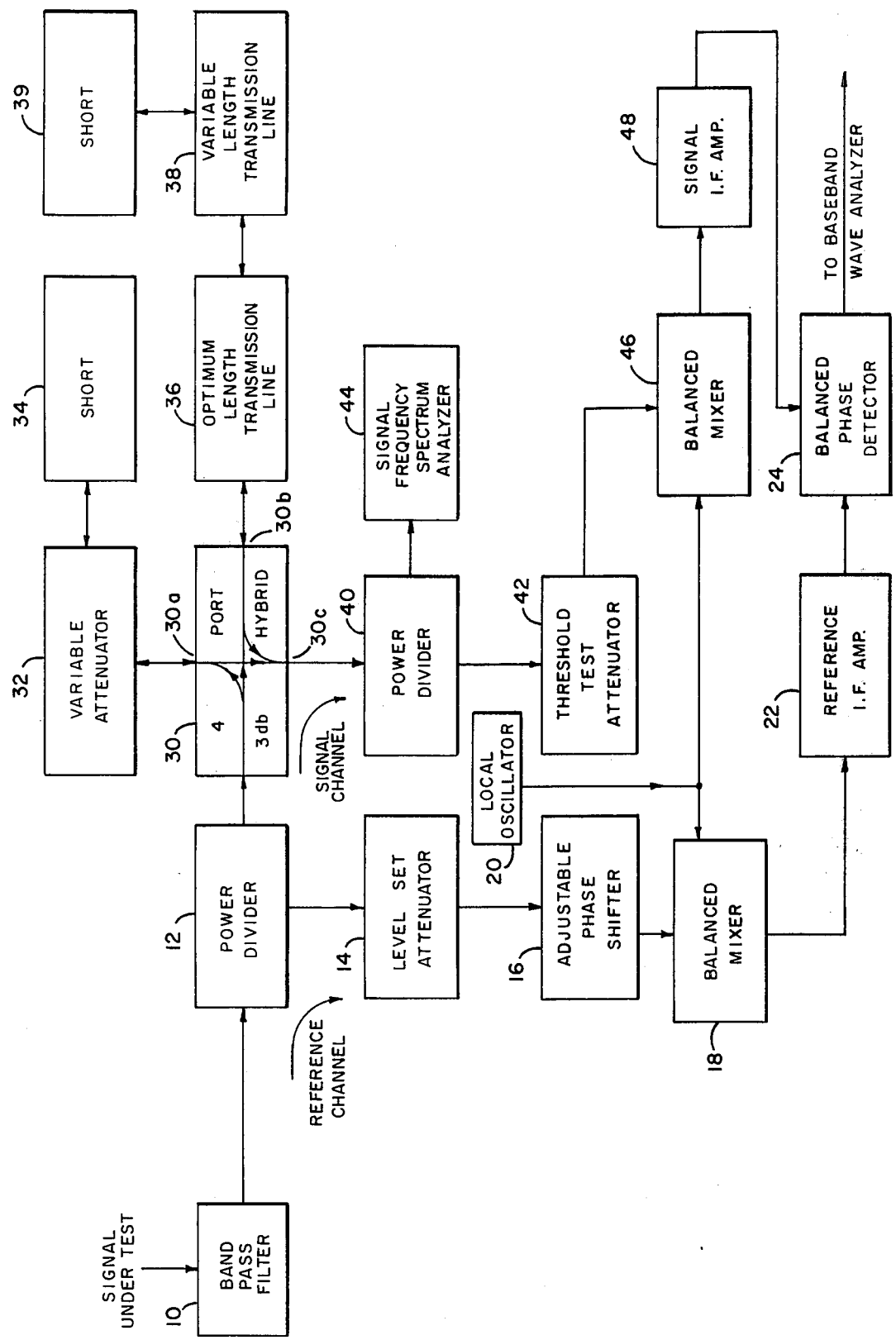
FIG. 1 is a block diagram of a preferred embodiment of the superheterodyne noise measuring discriminator.

Referring now to the drawing wherein like numbers represent like parts in each of the several figures, as shown in FIG. 1 a signal which is to be analyzed for phase or frequency modulation components is applied directly into a bandpass filter 10 to reject signal energy in the source input that is not in the band of interest. Bandpass filter 10 is required because of the inherent wide band nature of the discriminator. The discriminator covers approximately three decades (1,000 to 1) of frequency range in the 2 MHz to 2 GHz region. This provides a measurement capability in one apparatus that has previously been non-existant.

A signal whose near carrier sidebands are to be measured is coupled into bandpass filter 10 for excluding other possible signals, and is coupled from filter 10 into a power divider 12. Power divider 12 can be any one of several different elements such as a directional coupler or a three-db power splitter. The basic function performed by power divider 12 is to divide the incoming signal into two appropriate paths — the signal channel and the reference channel.

The signal flow path through the reference channel comes from an output of power divider 12 into a level set attenuator 14 which provides a means for adjusting the power level in the remainder of the reference channel. The adjusted signal power level output from attenuator 14 is then coupled into an adjustable phase shifter 16 to allow adjustment of the phase angle between the signal channel and reference channel during alignment of the discriminator. This is necessary because quadrature detection requires two signals in quadrature to allow frequency or phase modulation detection. The output of adjustable phase shifter 16 is then applied to a balanced mixer 18. Mixer 18 performs the function of frequency translation from the input signal frequency to the intermediate frequency range. Balanced mixer 18 has an input from a local oscillator 20 which is superheterodyned or mixed with the reference signal and the difference (intermediate) frequency is coupled as an output from mixer 18 and applied to an intermediate frequency (IF) amplifier 22. The output from amplifier 22 is then applied to a balanced phase detector 24.

The signal channel is formed from the other output signal coupled from power divider 12. The signal channel power is applied to a hybrid 30 whose main purpose is to provide signal power routing to allow carrier cancellation on the signal channel carrier. Hybrid 30 couples the signal channel power into three paths. One path from hybrid 30 is from port 30A through a variable attenuator 32 to a transmission line short circuit 34. The short circuit reflects the signal back into port 30A to provide a reflected signal at hybrid 30 which can be adjusted in amplitude. There is a phase reversal of the signal at short 34 because of the reflection, however, the only other phase shift occurring in this path is the result of phase shifting occurring as the attenuator is adjusted. This incidential phase shifting as attenuator levels are changed is inherent in such systems. The second signal channel path from hybrid 30 is from port 30B through the optimum length transmission line 36 and through a variable length transmission line 38 to a transmission line short 39. The signal is reflected at short 39 and returned to hybrid 30. The optimum length transmission line 36 allows wideband tuning because the exact length of line is not a critical factor. The small section of variable length transmission line 38 provides a phase shifting adjustment function for phase cancellation when the signal in this path returns to hybrid 30 and is combined with the signal entering port 30A. Combining the signals reflected back to hybrid 30 with the capability for attenuation adjustment in one path and phase shifting in the other path allows effective cancellation of unwanted signal carrier to be accomplished on the signal channel carrier. Cancellation of a signal carrier is accomplished by adjusting variable attenuation 32 to match the attenuation in the optimum length transmission line 36 path, then balancing the phase by adjusting the length of line inserted by variable length transmission line 38. During alignment this adjustment may require several trial settings of each adjustable element to attain optimum adjustment. A third path 30C from hybrid 30 allows the nulled carrier signal resulting from the combination of signals entering ports 30A and 30B to be applied through a power divider 40 to a threshold test attenuator 42 and to a spectrum analyzer 44. Spectrum analyzer 44 samples the signal from power divider 40 and provides the capability to observe the nulling process, allowing a proper null to be established. Spectrum analyzer 44 also provides the capability for accurately checking sideband level on the calibration carrier. The nulled carrier signal from attenuator 42 is applied to a balance mixer 46. Mixer 46 is also coupled to receive the output frequency from local oscillator 20. The output from mixer 46 is coupled to an IF amplifier 48. The IF output from amplifier 48 is then coupled as the signal channel input to detector 24. Mixer 46 translates the nulled signal frequency to a nulled carrier at an intermediate frequency. The intermediate frequency of both reference and signal channels is the same because of the common local oscillator 20.

Moderate FM noise on the local oscillator appears in phase in IF amplifiers 22 and 48 and will not be in quadrature as required to contribute to the output of phase detector 24. Therefore FM noise of the local oscillator is cancelled. The local oscillator frequency is selected to prevent interference by image responses in accordance with established superheterodyne receiver practice.

The signal coupled through threshold attenuator 42 is actually the signal utilized in measurement of FM noise. During a noise measurement, attenuator 42 is set for minimum attenuation. However, during the process of determining the basic system noise within the mensuration equipment, attenuator 42 allows sufficient attenuation to be inserted to ensure that the incoming signal is attenuated below system noise levels. This process is commonly referred to as threshold determination.

The capability for determining threshold noise level allows a thorough near carrier analysis to be accomplished, and allows internal noise of the equipment to be distinguished from input signal noise.

Balanced phase detector 24 operates as a quadrature phase detector. This is accomplished by using adjustable phase shifter 16 to align the reference channel signal in quadrature with the signal channel signal. The resulting output signal voltage from phase detector 24 is then a frequency discriminated noise modulation that has been translated from the carrier frequency region to selected baseband frequencies for further analysis. The output from the phase detector is then analyzed using the necessary amplification, bandpass filtering the recording devices in a wave analyzer circuit (not shown) to extract baseband data. Normal baseband circuitry may comprise a low noise amplifier, a spectrum analyzer with selectable bandwidths and an x-y plotter.

Figure 2:
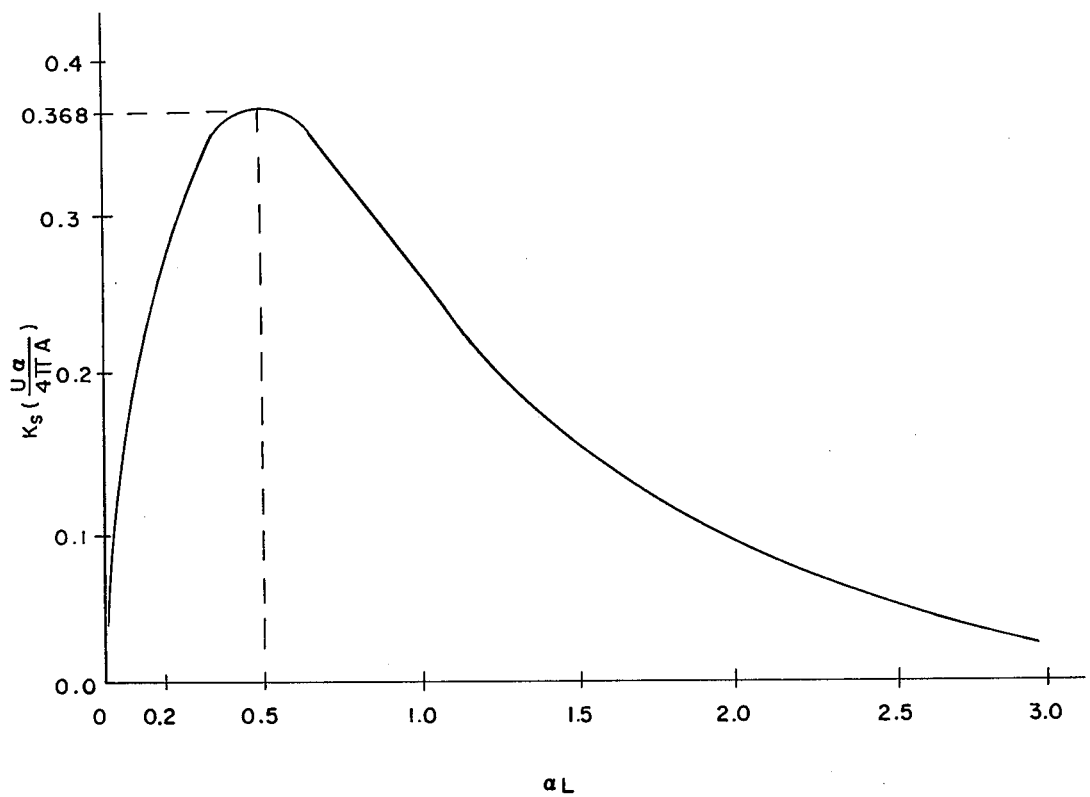
FIG. 2 is a graph of the discriminator normalized sensitivity versus transmission line length.

The relative sensitivity curve of the transmission line discriminator is shown normalized in FIG. 2. The optimum length of the line occurs when $\alpha L = 0.5$ and gives maximum sensitivity to the measurement apparatus. These characteristics are derived either through trigonometric or exponential derivations beginning with fundamental equations such as Helmholtz's equations. An important feature of this optimized line as noted in FIG. 2 is that the peak of the line length versus optimum output is a broad shape and not a sharp peak. Since $\alpha$ varies slowly, being approximately proportional to the square root of frequency, this particular characteristic allows near optimum operation over a considerable frequency range without appreciable degradation in the analyzer operation. Allowing a sensitivity degradation of up to 3 db permits the usable frequency range of a particular length to be more than 4 octaves.

The optimum length transmission line 36 is always determined at a particular design frequency. For the design frequency the optimum length line is always the electrical length of line at which total attenuation is one neper (8.68 decibels). As shown in FIG. 2, this length occurs for the particular embodiment after the signal has traversed the line and been reflected back through the line. Because of the broad bandwidth of utilization before sensitivity deteriorates, a single optimum length line used in the discriminator allows a broad range of frequency measurements to either side of the optimum frequency before noticeable loss of sensitivity affects operation of the circuit. In FIG. 2, the transmission line length is L, attenuation per unit length of line is $\alpha$, line transmission velocity is U, A is the amplitude in volts of the signal applied to the transmission line, and $K_s = \Delta v/\Delta f$ is the discriminator sensitivity in volts ($\Delta v$) per Hertz deviation ($\Delta f$). Utilizing 3 db sensitivity degradation as the controlling factor for the optimum line length allows an operating frequency range within 0.4 to 2.1 nepers of total attenuation, corresponding to a $(2.1/0.4)^2 = 27.6$ frequency range, to be satisfactorily obtained. Obviously, several selected optimum length transmission lines, such as coaxial cables can be utilized to provide a family of optimum length lines with overlapping attenuation curves to cover a very broad range of measurement.

It is common knowledge among those skilled in the art to establish calibration in similar systems using known FM sideband levels. Two basic techniques used in calibration are a direct carrier nulling operation and an indirect sideband level magnitude operation. The direct technique involves FM modulating a source with sufficient driving power to reach a condition wherein the carrier vanishes. Adding attenuation in the modulation signal source then allows a known sideband level to be established (40 db below the carrier at 18,600 Hertz is a widely used reference). This method is very useful on devices such as Klystrons which can easily be modulated by inserting the modulating source into the Klystron repeller circuit. However this method does not work when the source is a highly stable crystal oscillator.

The indirect technique can be done in one of two ways. A substitution technique may be used or the source can be separated from the near carrier analyzer and a sideband modulating circuit can be inserted between these two units to establish calibrated sidebands on the source. The carrier substitution method requires that a second source which can be easily modulated be substituted for the signal source to be measured. The carrier level of the substitute source is accurately matched in frequency and amplitude to the signal source to be measured. The substitute source then provides the sidebands at known levels to accomplish the calibration. After calibration, the signal to be measured is reconnected to the calibrated analyzer and the measurement is made using the calibration set up by the substitute source.

For the second indirect calibration technique, the modulating circuit inserted between the source to be measured and the analyzer uses a small portion of the source signal power as a base upon which sidebands are generated. These sidebands are then calibrated on a spectrum analyzer and properly phase shifted to be reinserted on the source signal as FM sidebands (of the desired magnitude).

With the application of a calibration signal with known FM sidebands the balanced phase detector 24 is now ready for adjustment. Optimumization of detector 24 involves setting adjustable phase shifter 16 for a maximum baseband analyzer readout with the appropriate power level in the reference channel and a properly nulled signal channel input both applied simultaneously to balanced phase detector 24. Spectrum analyzer 44 is used to determine proper sideband levels on the calibration input signal. The phase detector 24 output is applied to the baseband analysis equipment (not shown) which is tuned to the angle modulation frequency and observed during the calibration process.

Completion of the calibration requires that the readout device in the baseband analysis equipment be used to record the maximized output of the bandpass filter. This calibrates the entire system. It is important that the calibration signal and the signal to be analyzed have the same carrier amplitude, otherwise the calibration will not be valid.

In normal operation, threshold test attenuator 42 is set for minimum attenuation. This condition applies maximum available power to balanced phase detector 24. However, during the threshold measurement operation, threshold test attenuator 42 inserts sufficient attenuation to adequately suppress the signal channel power allowing a measurement of the basic noise power within the analyzer system. This internal system noise as measured in this manner is termed "threshold noise".

A noise measurement is then made by applying the signal to be analyzed to bandpass filter 10. The FM noise data is measured and recorded by the baseband equipment using the desired filter bandwidths and covering the desired modulation frequency range.

Figure 3:
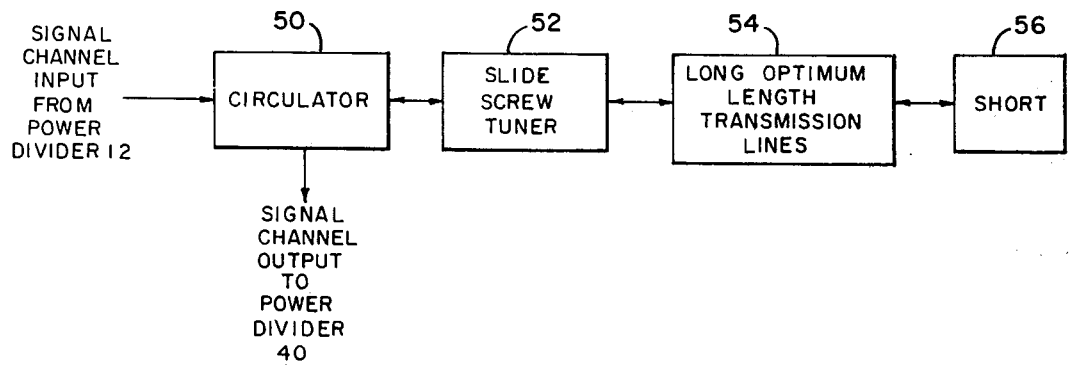
FIGS. 3–4 are alternative embodiments of the superheterodyne noise measuring discriminator of FIG. 1.

FIG. 3 discloses an alternative embodiment to that of FIG. 1 wherein the hybrid 30 and related circuitry coupled to hybrid ports 30A and 30B are replaced by a circulator 50 with a serially coupled slide screw tuner 52, optimum length transmission line 54, and short circuit 56 coupled to one port thereof. The signal power from the signal channel path from power divider 12 is applied to circulator 50. Circulator 50 forms two distinct signal flow paths. The first signal flow path couples the incoming signal power from power divider 12 into slide screw tuner 52, optimum length transmission line 54 and short 56. Adjustment of slide screw tuner both laterally and radially establishes a carrier null on the signal power returning from short circuit 56.

The second signal path is established from the portion of the nulled signal remaining after the nulling process. This signal is routed to power divider 40. Utilizing the circulator in place of the hybrid allows the discriminator operation to occur with fewer components while increasing the system sensitivity by 6 db. The circulator does not have the extended frequency range over which the hybrid can operate.

Figure 4:
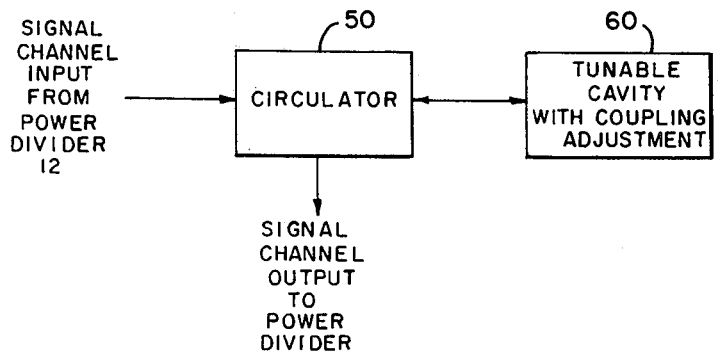

FIG. 4 is an alternative embodiment to that of FIG. 1 wherein hybrid 30 and the related circuitry coupled to hybrid ports 30A and 30B are replaced by circulator 50 and a high Q cavity resonator 60 coupled thereto. The high Q cavity resonator more efficiently performs the discrimination function at the higher radio frequencies. Signal power from the signal channel path of power divider 12 is applied to circulator 50 and is coupled therethrough into cavity resonator 60. High Q cavity resonator 60 receives the signal frequency signal from the circulator and absorbs most of the carrier power in the signal. Absorption of the signal carrier by cavity resonator 60 accomplishes the carrier nulling, reflecting only a small portion of the incident power with the associated sidebands. These reflected sidebands form the signal to be further processed, and is routed back through circulator 50 and coupled to power divider 40. A 6 db improvement of threshold available is accomplished by using circulator 50 (in the place of a hybrid) and reduces the number of components required in the system.

This embodiment can be implemented either with waveguide or coaxial line components. Coaxial transmission line allows wider bandwidths to be effectively covered with fewer component changes than with waveguide. Basically, a coaxial system can easily cover several octaves with the only change required being the circulator, cavity and local oscillator. Waveguide systems can slightly achieve less than an octave in a practical system.

Related discriminator devices are disclosed in a co-pending application entitled "Wide Operating Frequency Range Superheterodyne Discriminators" by G. J. Rast, Jr. T. A. Barley, R. L. Hammond, and G. R. Ashley. This co-pending application was filed simultaneously with applicants' application and assigned to the US Government as represented by the Department of Army.

Several alternative embodiments have been given to the preferred embodiment of FIG. 1. Obviously modification and variations of the present invention are even further possible in light of the above disclosure and will become apparent to those knowledgeable in the art. It is, therefore, to be understood that within the scope of the appended claims, the invention may be practiced otherwise than as specifically disclosed herein.

We claim:

1. A superheterodyne noise measuring discriminator for measuring input frequency modulation noise on a carrier signal comprising:
    a bandpass filter having an input and an output, the input being disposed to receive said carrier with modulation noise signal;
    a first and second power divider means, each having an input and first and second outputs, the input of said first power divider being coupled to the output of said filter to receive said carrier with modulation noise signal;
    signal coupling and routing means having an input port coupled to the first output of said first divider and having a first output port; said output port being coupled to the input of said second power divider;
    quadrature detection means having first and second inputs and an output, said first input being coupled to the first output of said second power divider and said second input being coupled to the second output of said first power divider, the output of said detection means being disposed for coupling output measurement signals therefrom;
    a signal level attenuator, a phase shifter, a first balanced mixer and a first intermediate frequency amplifier connected in series between the second output of said first divider and the second input of said quadrature detection means; and a threshold test attenuator, a second balanced mixer, and a second intermediate frequency amplifier connected in series between the first output of said first divider and the first input of said quadrature detection means, said threshold test attenuator providing means for determining and correcting for discriminator internal noise.

2. A superheterodyne noise measuring discriminator as set forth in claim 1 and further comprising a local oscillator having a common output frequency coupled to said first and second balanced mixers for stimulating an intermediate frequency output from said mixers.

3. A superheterodyne noise measuring discriminator as set forth in claim 2 wherein said signal coupling and routing means is a hybrid, said hybrid further comprising second and third output ports; and further comprising an optimum length transmission line and a transmission line short circuit coupled in series, with said optimum length line being coupled to said second port of said hybrid; a variable attenuator and a transmission line short circuit coupled in series, with said attenuator being coupled to said third port of said hybrid for attenuating signals initially coupled through said hybrid and directing said signals back to said hybrid.

4. A superheterodyne noise measuring discriminator as set forth in claim 3 and further comprising a variable length transmission line coupled between said optimum length line and said short circuit for phase shifting signals coupled therethrough; a spectrum analyzer coupled to the second output of said second power divider; and wherein said optimum length transmission line is a coaxial line having a precise length which provides one half neper of attenuation across the electrical length of the line for a predetermined frequency.

5. A superheterodyne noise measuring discriminator as set forth in claim 2 wherein said signal coupling and routing means is a circulator, said circulator further comprising a second output port; said discriminator further comprising a slide screw tuner; a transmission line having a length which provides approximately one half neper of attenuation across the electrical length of the line for a predetermined frequency, for providing sensitivity within 3 db of optimum; a transmission line short circuit connected in series with said tuner being coupled to said second output of said circulator; and a spectrum analyzer coupled to the second output of said second power divider.

6. A superheterodyne noise measuring discriminator as set forth in claim 5 wherein said transmission line has a precise length to provide one half neper of attenuation at the operating frequency.

7. A superheterodyne noise measuring discriminator as set forth in claim 2 wherein said signal coupling and routing means is a circulator which further comprises a second output port; said discriminator further comprising a one port microwave cavity resonator coupled to said second output port of said circulator; and a spectrum analyzer coupled to the second output of said second power divider.

* * * * *